United States Patent [19]

Bartlow

[11] Patent Number: 5,414,296

[45] Date of Patent: May 9, 1995

[54] VENETIAN BLIND CELL LAYOUT FOR RF POWER TRANSISTOR

[75] Inventor: Howard D. Bartlow, West Linn, Oreg.

[73] Assignee: Spectrian, Inc., Mountain View, Calif.

[21] Appl. No.: 236,312

[22] Filed: May 2, 1994

Related U.S. Application Data

[63] Continuation-in-part of Ser. No. 994,745, Dec. 22, 1992, Pat. No. 5,329,156, and a continuation-in-part of Ser. No. 995,286, Dec. 22, 1992, abandoned.

[51] Int. Cl.$^6$ ............................................. H01L 29/72
[52] U.S. Cl. ................................. 257/579; 257/266; 257/341; 257/773; 257/786; 257/923
[58] Field of Search ............... 257/266, 341, 579, 773, 257/786, 923

[56] References Cited

U.S. PATENT DOCUMENTS

| | | | |
|---|---|---|---|
| 3,623,218 | 11/1971 | Mitari et al. | 257/579 |
| 4,236,171 | 11/1980 | Shen | 257/579 |
| 4,642,665 | 2/1987 | Lade et al. | 257/39 |

Primary Examiner—Edward Wojciechowicz
Attorney, Agent, or Firm—Townsend and Townsend Khourie and Crew

[57] ABSTRACT

Operating characteristics of an electronics device in which alternating currents flow are improved by reducing positive electromagnetic coupling between currents. This is accomplished by altering the direction of a current flow to obtain negative coupling through current flow in the same direction, or by minimizing electromagnetic coupling through perpendicular current flow, or by increasing the spacing between two electromagnetically coupled currents. In a bipolar transistor structure a feed structure for emitter and base current includes wire bonding pads aligned so that emitter current and base current flow to wire bonding pads perpendicular to the direction of collector current flow and with adjacent emitter currents and base currents flowing in the same direction. Each feed structure includes a plurality of interdigitated fingers for contacting emitter and base regions, all emitter and base currents in said interdigitated fingers of all feed structures flowing in the same direction as the collector.

10 Claims, 4 Drawing Sheets

VENETIAN BLIND CELL LAYOUT FOR RF POWER TRANSISTOR

This application is a continuation-in-part of patent application Ser. No. 07/994,745, filed Dec. 22, 1992 for IMPROVED FEED BUS FOR RF POWER TRANSISTORS, now U.S. Pat. No. 5,329,156 and Ser. No. 07/995,286, filed Dec. 22, 1992, now abandoned for VENETIAN BLIND CELL LAYOUT FOR RF POWER TRANSISTOR, both applications assigned to Spectrian, Inc., the present assignee.

BACKGROUND OF THE INVENTION

This invention relates generally to RF power transistors and, more particularly, the invention relates to a repetitive feed structure for such devices which reduces thermal gradients.

FIG. 1 is a schematic of a bipolar NPN transistor having emitter and collector regions separated by a base region. Applying Kirchoff's current law, emitter current, $I_e$, equals the sum of base current, $I_b$, and collector current, $I_c$.

Typically, emitter and base contacts are provided on one (front) surface of the transistor and the collector contact is made to the opposing (back) surface with base and emitter wire bonding pads positioned centrally in the metal structure with current flowing to and from interdigitated finger contacts as shown in FIG. 2. In a typical RF power transistor cell layout, repeating techniques are used to replicate a base and emitter bus structure across the die area with the bus structure arranged in rows of alternating or "flipped" emitter-base orientation. This causes alternating interdigitated base and emitter currents to flow in the same direction as the collector current or in opposite direction to the collector current.

The bipolar transistor current relationships introduce mutual magnetic coupling or magnetic flux linkage between currents. As illustrated in FIG. 3, parallel currents flowing in the same direction produce negative magnetic coupling with the current tending to oppose each other. However, when the parallel currents flow in opposite directions as shown in FIG. 4, mutual coupling is enhanced or positive and the currents tend to support each other.

If the conductors in FIG. 4 are reoriented such that the angle between two current flows is 90°, coupling is minimal. It can be shown that the mutual inductance arising from two coupled wires is given by:

$$Lm = \frac{\mu}{4\pi} \int_{L1} \int_{L2} \frac{ds1 \cdot ds2}{r12}$$

where s1 and s2 are vector elements along the direction of the wires, r12 is the distance between these elements, L1 and L2 are the line integral paths, and the permeability $\mu$ is constant. Clearly, when s1 and s2 are orthogonal, their dot product is zero, and the resulting mutual inductance is also zero. Accordingly, 90° coupling can be beneficial.

SUMMARY OF THE INVENTION

The invention stems from a recognition of the significant alternating currents flowing in close proximity to one another in RF and other alternating current devices in semiconductor layers and in metal or silicide interconnections on surfaces thereof. All such currents can create strong transformer type electromagnetic effects such that current flows are opposed or impeded when the currents are parallel and in the same direction (negatively coupled). Currents that are parallel but flow in opposite directions are enhanced or supported, while currents flowing at right angles receive no enhancement or opposition. Consequently, deleterious feedback effects from current coupling can be minimized or eliminated by proper device design.

Generally, in carrying out the invention all alternating current flow in or on a device must be identified along with proximity of current flows. All positive or supporting current coupling is eliminated by changing metal patterns or contact points so that current vectors are at 0° (negative coupling) or at 90° or 270° (minimal or zero coupling). Bipolar junction transistors can be defined as base-current controlled switches, hence, supporting feedback to the base current must be changed to zero or negative otherwise runaway situations can occur. A similar situation is true for gate currents in field-effect transistors.

In accordance with one embodiment of the present invention, a repetitive feed structure is provided wherein negative or zero coupling is provided between the collector current of an RF power bipolar transistor and the emitter and base currents, thus stabilizing currents across the transistor device. Accordingly, hot spots are reduced in the transistor during operation thereby leading to increased operating stability and longer life.

In a preferred embodiment, multiple bus structures having interdigitated base and emitter feed contacts are arranged generally perpendicular to collector current so that the emitter and base bus currents are generally perpendicular to the collector current with minimum magnetic coupling therebetween. Further, all the bus structures have the same orientation so that emitter and base currents in the interdigitated fingers have negative coupling with respect to the collector current. The geometric layout minimizes positive feedback while optimizing negative feedback, resulting in better current sharing and a minimal thermal gradient.

The invention and objects and feature thereof will be more readily apparent from the following detailed description and appended claims when taken with the drawing.

DETAILED DESCRIPTION OF THE ILLUSTRATED EMBODIMENT

Figure 5:
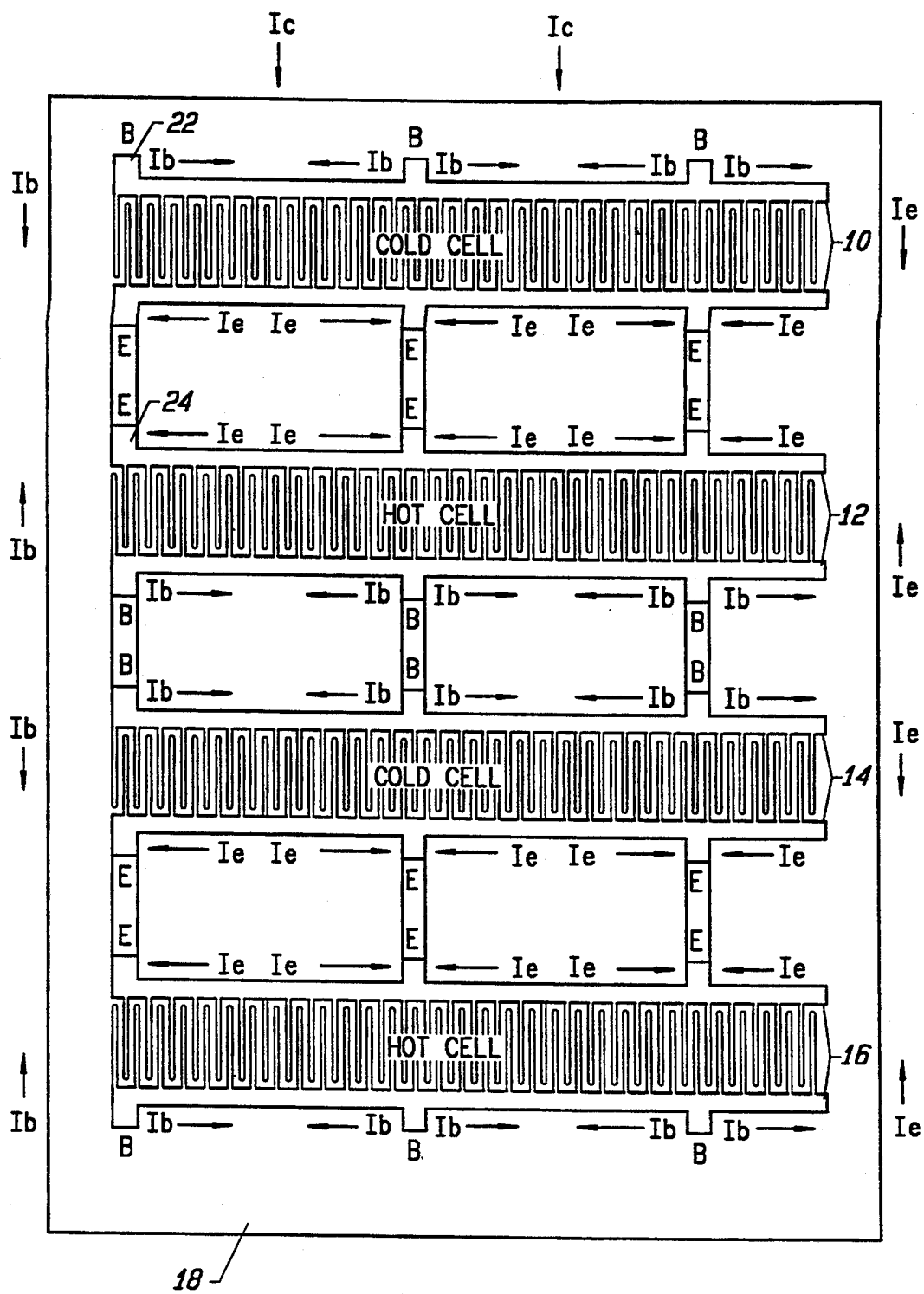
FIG. 5 illustrates a plurality of cell structures in which adjacent structures are flipped by 180° in layout in accordance with the prior art.

Referring now to the drawing, FIG. 5 illustrates a conventional layout of emitter and base bus structures in a bipolar RF power transistor. A plurality of feed structures 10, 12, 14, 16 are provided on one surface of the transistor semiconductor body 18 in parallel arrangement and perpendicular to the collector current, $I_c$, flowing in the opposite surface of the semiconductor body 18. It will be noted that adjacent feed structures and interdigitated emitter and base contacts are "flipped" or rotated 180° in layout so that base contacts 22 of some adjacent structures can be integrally connected together and emitter wire bonding contacts 24 of other adjacent structures can be integrally connected together. While the interconnect metallization may be facilitated with the flipped contact structures, only half of the emitter and base interdigitated currents have negative coupling with the collector current, while the other half of the interdigitated currents flow opposite to the collector current and thus have positive coupling with the collector current. The positive coupling leads to higher temperature areas in the transistor while the negative coupling results in lower temperature areas. This temperature and operation imbalance reduces operating efficiency and device reliability and seriously limits power performances.

Figure 6:
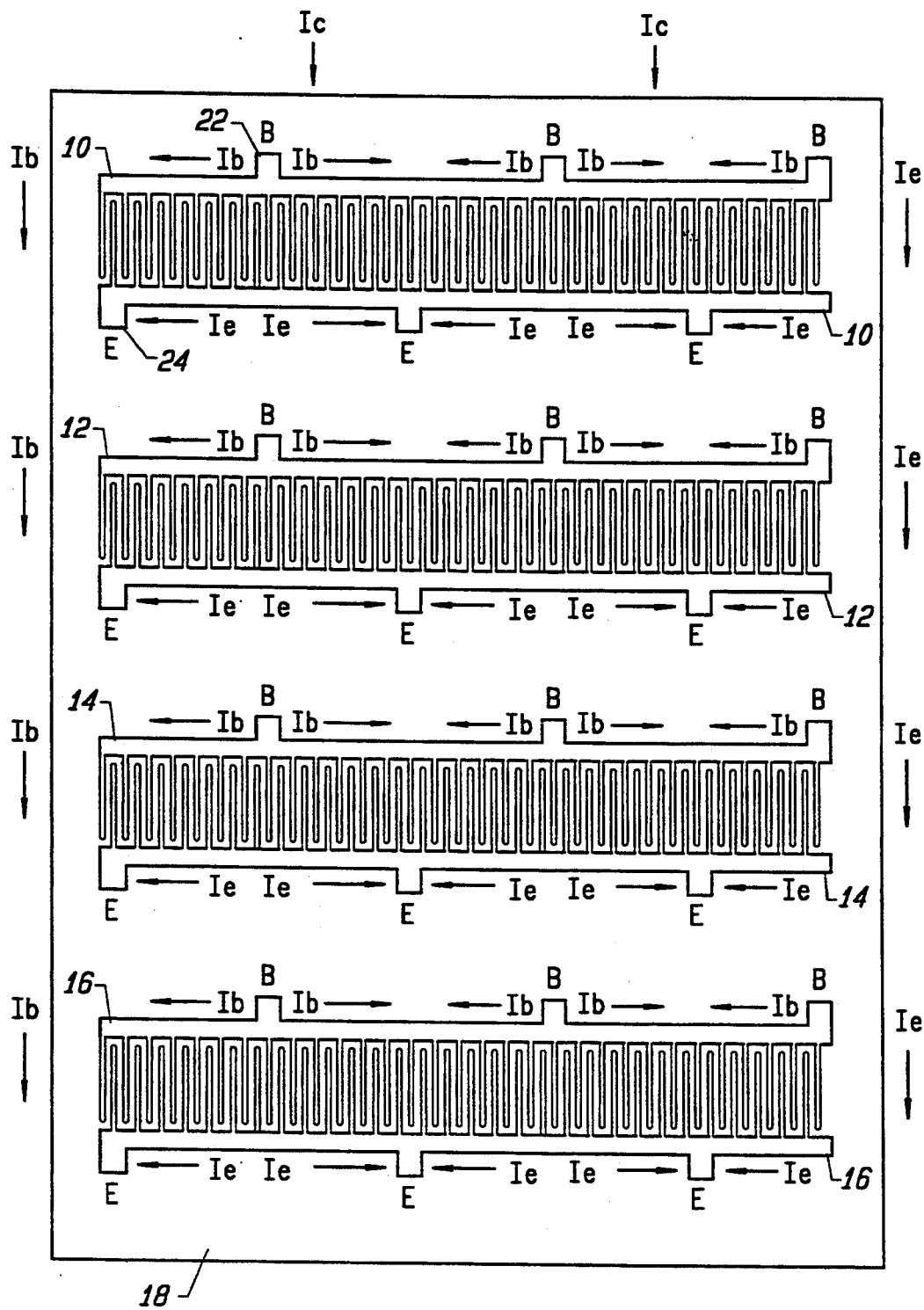
FIG. 6 illustrates a plurality of cell structures in which adjacent structures have the same orientation in accordance with the invention.

FIG. 6 illustrates a layout of emitter and base bus structures in accordance with the invention. Like elements in FIGS. 5, 6 have the same reference numerals. The invention encompasses two important features which distinguish the FIG. 6 layout from the FIG. 5 prior art layout. First, all feed structures and interdigitated contacts have the same orientation; adjacent structures are not flipped. Accordingly, all interdigitated finger currents are the same in direction as the collector current thus maintaining negative coupling between the interdigitated base and emitter currents and with the collector current.

Second, the emitter wire bonding pads 24 are offset from the base wire bonding pads 22 so that the emitter and base currents flowing to or from the bonding pads in the feed structures have negative coupling with each other. Further, the currents in the feed structures which flow to or from the bonding pads are perpendicular to the collector current with minimal or zero coupling therebetween.

Figure 1:
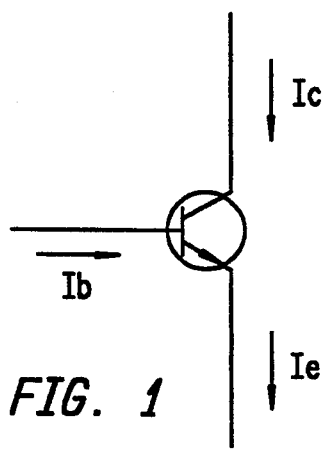
FIG. 1 is a schematic of an NPN bipolar transistor illustrating emitter, base, and collector currents.
Figure 2:
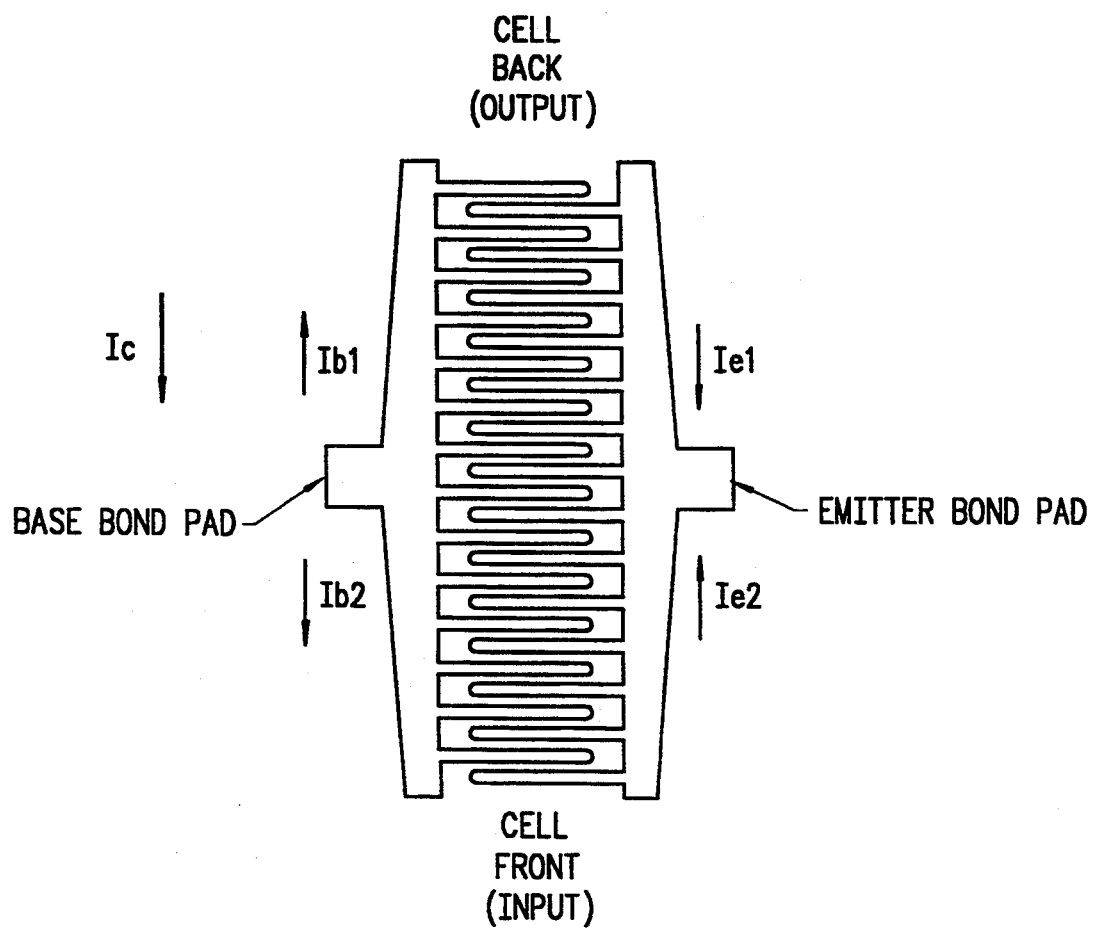
FIG. 2 is plan view of a conventional feed structure for a bipolar transistor.
Figure 3:
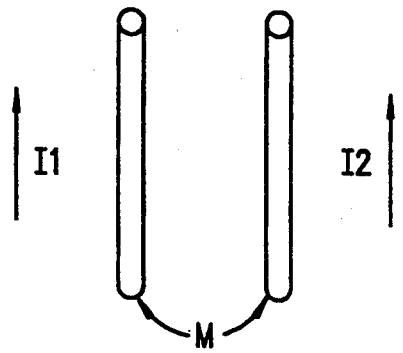
FIG. 3 and FIG. 4 are schematics illustrating negative and positive mutual coupling between two parallel currents.
Figure 4:
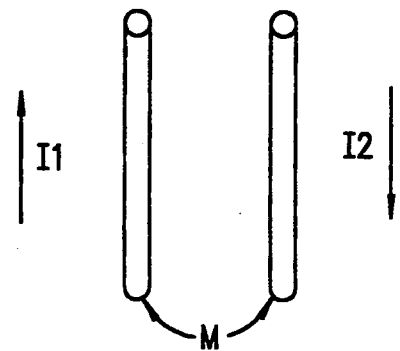
Figure 7:
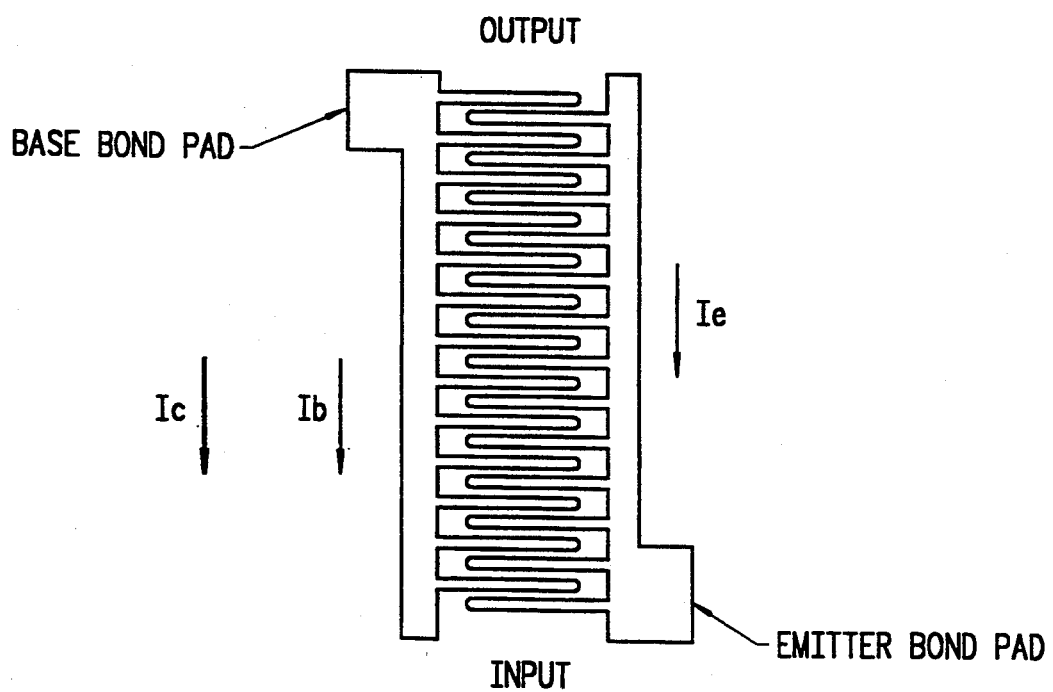
FIG. 7 is a plan view of a portion of a feed structure for a bipolar transistor in accordance with another preferred embodiment of the invention.

This latter feature is further illustrated in the portion of a feed structure shown in FIG. 7, which is a plan view of a metallic feed structure for a bipolar transistor as described in copending application Ser. No. 07/994,745, supra. The feed structure is configured so that all currents tend to flow in the same direction. This is readily accomplished in the illustrated embodiment by relocating the bonding pads for the base and emitter contacts. Note that all currents tend to flow in the same direction. Therefore, both $I_e$ and $I_c$ now have negative mutual feedback to $I_b$ and to each other for much improved cell feed uniformity and thermal balance. Thus, an emitter contact located near the back of the cell has the same current as an emitter contact located near the front of the cell. The controlling base currents are analogously equal. Expressing the current stabilization mathematically:

$$\nabla \cdot Ib = 0$$

and $$\nabla \cdot Ie = 0$$

where $\nabla$ is the del operator and, in rectangular coordinates, is defined as:

$$\nabla = \frac{\partial}{\partial x} ax + \frac{\partial}{\partial y} ay + \frac{\partial}{\partial z} az$$

The base and emitter currents are now constant over space. Equal currents in given regions will have equal temperatures in the same regions. Thus:

$$\nabla \cdot T(x,y) = 0$$

where T(x,y) describes the temperature as a function of space.

Accordingly, by enhancing negative coupling of currents in an RF power device, hot spots in the device are reduced or eliminated thereby increasing the device performance and the mean time to failure of the device.

If the elimination of all positive electromagnetic feedback is not possible, it is most important to remove high currents from close proximity to the base or gate currents. Then positive feedback affecting the collector (drain) to emitter (source) should be eliminated or reduced. From experimentation it has been determined that coupling of collector semiconductor current to base-metal bus bars, basefingers, and base semiconductor layers are the most important situations to correct. Next in importance are emitter and base current coupling which may be partially ameliorated by greater separation distances. Lastly, emitter-collector current coupling should be corrected. Care in addressing these major design considerations results in improved device efficiency, linearity, gain, saturated power ruggedness, stability, and reliability.

While the invention has been illustrated with reference to a bipolar transistor embodiment, the description is illustrative of the invention and is not to be construed as limiting the invention. The invention encompasses other RF power devices (i.e., FETs, etc.) by creating minimal or negative mutual magnetic coupling between currents which flow anywhere in or on the device. Thus, various modifications and applications may occur to those skilled in the art without departing from the true spirit of the invention as defined in the claims.

What is claimed is:

1. A method of improving operating characteristics of a semiconductor RF power transistor device in which a plurality of alternating currents flow, said method comprising the steps of
   a) determining the location and direction of flow of said currents within said semiconductor transistor device, and
   b) providing a metal structure on a surface of said semiconductor transistor device including a plurality of current feed structures and interdigitated fingers arranged to establish current flow to obtain negative electromagnetic coupling.

2. The method as defined by claim 1 wherein step b) establishes the direction of a current flow to obtain negative electromagnetic coupling.

3. The method as defined by claim 2 wherein step b) establishes the direction of a current flow to reduce electromagnetic coupling.

4. The method as defined by claim 3 wherein step b) includes increasing the spacing between currents, directing currents in parallel to achieve negative electromagnetic coupling, and directing currents perpendicular to each other to minimize electromagnetic coupling.

5. A bipolar RF power transistor structure comprising a semiconductor body having a collector region in which collector current flows in a first direction in said semiconductor body, a plurality of base regions formed in said collector region, at least one emitter region formed in each base region, and a bus structure including a plurality of feed structures on one surface of said semiconductor body for carrying currents to and from said base regions and said emitter regions, each of said feed structures including wire-bonding pads positioned so that emitter currents and base currents in all feed structures flow to and from wire bonding pads perpendicular to said first direction and adjacent emitter currents and base currents flow in the same direction.

6. The structure as defined by claim 5 wherein said bus structure further includes a plurality of interdigitated fingers for contacting emitter and base regions through said feed structure, all emitter and base currents in said interdigitated fingers flowing in said first direction.

7. A bipolar RF power transistor structure comprising a semiconductor body having a collector region in which collector current flows in a first direction, a plurality of base regions formed in said collector region, at least one emitter region formed in each base region, and a bus structure including a plurality of feed structures on one surface of said semiconductor body, a plurality of interdigitated fingers for contacting emitter and base regions through said feed structures, all emitter and base currents in said interdigitated fingers of said structure flowing in said first direction.

8. An RF power transistor structure comprising a semiconductor body having a first (collector/drain) region and a second (emitter/source) region controlled by a third (base/gate) region, current of said first region flowing in a first direction, a bus structure on one surface of said semiconductor body including a plurality of feed structures for carrying currents to and from said second and third regions, each of said feed structures including wire-bonding pads positioned so that second region current and third region current in all feed structures flow to and from wire bonding pads perpendicular to said first direction and adjacent second region current and third region current flow in the same direction.

9. The RF power transistor structure as defined by claim 8 wherein said bus structure includes a plurality of interdigitated fingers for contacting said second region and said third region through said feed structures, all currents in said interdigitated fingers flowing in said first direction.

10. An RF power transistor structure comprising a semiconductor body having a first (collector/drain) region and a second (emitter/source) region separated by a third (base/channel) region, current of said first region flowing in a first direction, and a bus structure including a plurality of feed structures for carrying currents to and from said second and third regions, and a plurality of interdigitated fingers for contacting said second region and said third region through said feed structures, all currents in said interdigitated fingers flowing in said first direction.

* * * * *